(12) United States Patent
Kajigaya

(10) Patent No.: US 9,619,319 B2
(45) Date of Patent: Apr. 11, 2017

(54) SEMICONDUCTOR DEVICE AND ERROR CORRECTION INFORMATION WRITING METHOD

(71) Applicant: Micron Technology, Inc., Boise, ID (US)

(72) Inventor: Kazuhiko Kajigaya, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 14/457,666

(22) Filed: Aug. 12, 2014

(65) Prior Publication Data

US 2015/0046774 A1    Feb. 12, 2015

(30) Foreign Application Priority Data

Aug. 12, 2013   (JP) .................................. 2013-167782

(51) Int. Cl.
*G06F 11/10*    (2006.01)

(52) U.S. Cl.
CPC ................................ *G06F 11/1008* (2013.01)

(58) Field of Classification Search
CPC ..... G06F 11/1008; G11C 29/78; G11C 29/04; G11C 13/003; G11C 13/0069; G11C 29/44; G11C 29/76; G11C 29/808; G11C 7/1039; G11C 11/16; G11C 2029/4402
See application file for complete search history.

(56) References Cited

U.S. PATENT DOCUMENTS

| 2014/0241040 A1* | 8/2014 | Jeong .................. G11C 11/5607 365/148 |
| 2014/0241043 A1* | 8/2014 | Bae ........................ G11C 29/44 365/148 |
| 2014/0244931 A1* | 8/2014 | Kim .................... G11C 13/0069 711/118 |

FOREIGN PATENT DOCUMENTS

JP    2008310876 A    12/2008

* cited by examiner

*Primary Examiner* — Albert Decady
*Assistant Examiner* — Kyle Vallecillo
(74) *Attorney, Agent, or Firm* — Schwegman Lundberg & Woessner, P.A.

(57) ABSTRACT

A semiconductor device includes first and second memory cell arrays, each including a plurality of memory cells, each of which is connected between first and second terminals and is configured to be written to a first resistance state by applying a first current in a first direction between the first and second terminals and be written to a second resistance state by applying a second current in a second direction opposite to the first direction between the first and second terminals. The semiconductor device further includes an error-correction circuit and a control circuit. Additional apparatus and methods are disclosed.

16 Claims, 13 Drawing Sheets

SEMICONDUCTOR DEVICE AND ERROR CORRECTION INFORMATION WRITING METHOD

RELATED REFERENCE

This application is based upon and claims the benefit of priority to Japanese patent application No. 2013-167782 filed on Aug. 12, 2013, the disclosure of which is incorporated herein in its entirety by reference thereto.

BACKGROUND

Japanese Patent Kokai Publication No. JP-P2008-310876A (Patent Literature 1) discloses a technology that reduces the write time of a spin transfer torque magnetization switching type magnetic random access memory (STT-RAM: Spin-Transfer Torque Random Access Memory). The technology disclosed in Patent Literature 1 writes to an applicable memory cell in the direction of a first current requiring a longer write time before write data is determined in order to reduce the write time of a magnetic random access memory. Then, after the write data is determined, the current in the first direction is kept supplied to the memory cell written in the first current direction, and the direction of the write current for a memory cell written in a second current direction, the write time of which is relatively short, is changed to the second direction. For instance, the write in the first current direction inverts the magnetization direction of a fixed layer and a free layer in a magnetic tunnel junction (MTJ) element from a parallel state to an antiparallel state. The write in the second current direction inverts the magnetization direction of the fixed layer and the free layer from the antiparallel state to a parallel state.

The disclosure of Patent Literature 1 listed above is incorporated herein in its entirety by reference thereto.

In Patent Literature 1, the memory cell group, for which the write time is reduced, is configured to store write data and is not configured to store error-correction information. Here, the write data means one of normal information, i.e., information supplied to a chip terminal from the outside when used by a user. This write data is different from error-correction information.

Patent Literature 1 does not make any reference to a technology relating to error-correction (i.e., ECC: Error Check and Correction) and an application to error-correction technologies.

In Patent Literature 1, a write current is uniformly supplied in the first direction in the memory cell group storing the normal information regardless of the initial state thereof. Therefore, for instance, even when the same data is written on a memory cell with the magnetization direction initially in a parallel state, a current must be supplied in a parallel state after a write current is supplied in an antiparallel state. As a result, when the technology disclosed in Patent Literature 1 is applied, a consumption current of the magnetic random access memory storing the normal information increases.

DETAILED DESCRIPTION

Embodiment 1

A first embodiment will be described with reference to the drawings.

Figure 1:
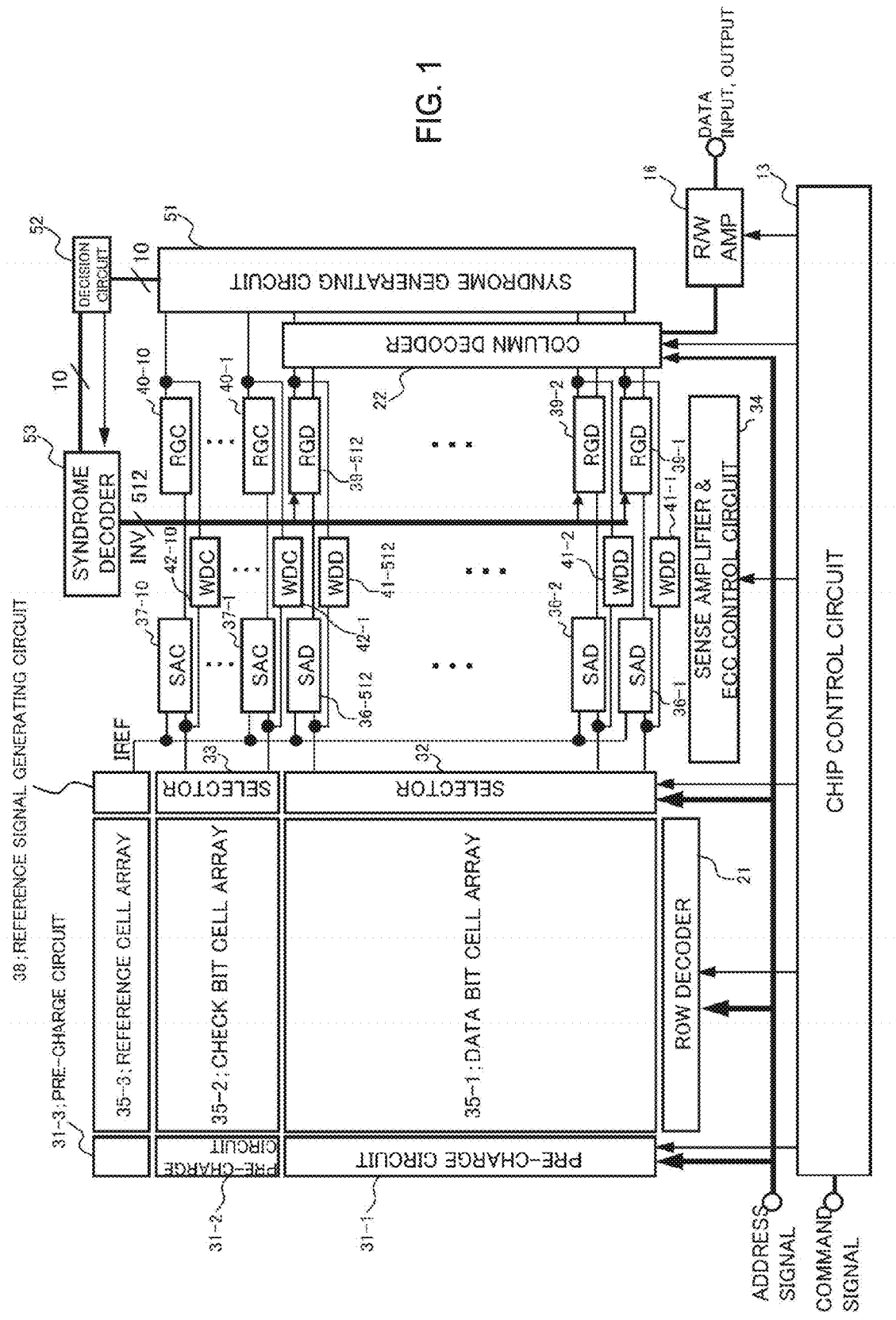
FIG. 1 is a block diagram of a memory cell array 2 relating to a first embodiment and peripheral circuits thereof.

FIG. 1 is a block diagram of a memory cell array 2 and peripheral circuits thereof.

Details will be described later, but in each of the first to third embodiments, a semiconductor device includes first and second memory cell arrays (a data bit cell array 35-1 and a check bit cell array 35-2 in FIG. 1), each including a plurality of memory cells (62 in FIG. 3), each of which is connected between first and second terminals (for instance, LBL0 and VCS in FIG. 3) and is configured to be written to a first resistance state by applying a first current in a first direction between the first and second terminals and be written to a second resistance state by applying a second current in a second direction opposite to the first direction between the first and second terminals, the first memory cell array configured to store normal information, and the second memory cell array configured to store error-correction information. The semiconductor device also includes an error-correction circuit (circuits 51 to 53 in FIG. 1) configured to generate error-correction information based on normal information, and a control circuit (a chip control circuit 13 in FIG. 1) configured to apply a third current to a memory cell of the second memory cell array in one of the first and second direction between the first and second terminals, during a first period when the error-correction circuit generates the error-correction information based on the data information.

Figure 2:
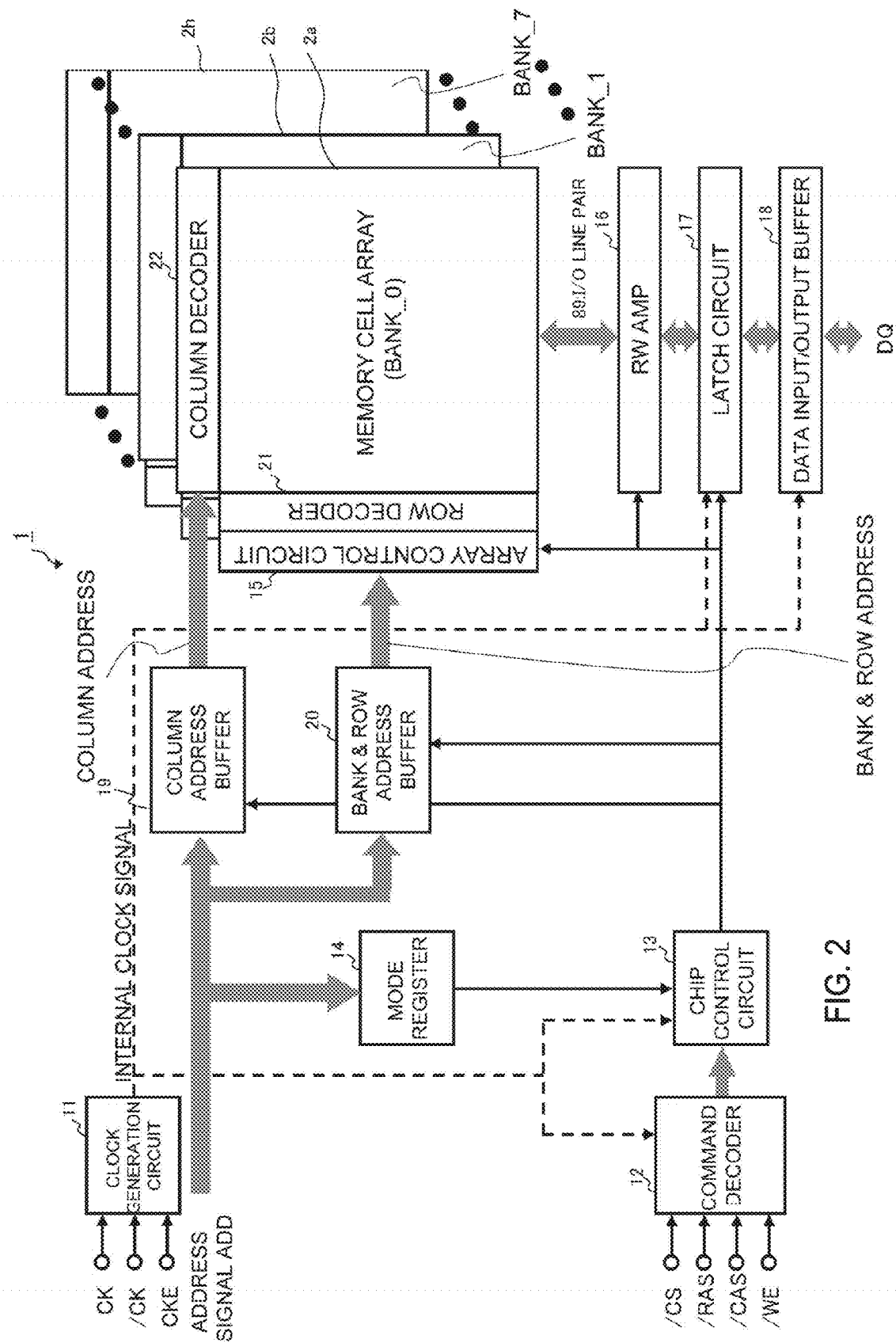
FIG. 2 is a block diagram showing an overall configuration of a semiconductor device 1 relating to the first embodiment.

Likewise, details will be described later, but in the first to third embodiments, a method is provided to include generating error-correction information based on write information (data input/output as shown in FIG. 1 and DQ information as shown in FIG. 2), and applying, during the generating of the error-correction information, an assist current to each of memory cells included in a memory cell array (the check bit cell array 35-2 as shown in FIG. 1) configured to store error-correction information.

FIG. 2 is a block diagram showing the semiconductor device 1 relating to the first embodiment.

The semiconductor device 1 as shown in FIG. 2 comprises a memory cell array. This memory cell array comprises memory cell arrays 2a to 2h using a magnetic random access memory (STT-RAM) that performs spin transfer torque writing as a resistance variable memory cell. The memory cell array is constituted by a plurality of banks, for instance, banks 0 to 7. In the description below, the memory cell array is referred to as "the memory cell array 2" unless the memory cell arrays 2a to 2h need to be particularly distinguished from each other.

The semiconductor device 1 comprises an ECC circuit (omitted in FIG. 2) and an on-chip ECC function. When data is read from a memory cell, the ECC function enables correcting an error (error-correction) of the read data by calculating a pre-stored check bit (referred to as ECC correction code or error-correction information) and the read data.

The semiconductor device 1 comprises external clock terminals CK and /CK, a clock enable terminal CKE, command terminals /CS, /RAS, /CAS, and /WE, and a data input/output terminal DQ as external terminals. Note that a signal with "/" attached to the beginning of the signal name indicates that the signal is an inversion signal or a low active signal of the corresponding signal in the present description. Therefore, for instance, CK and /CK are complementary signals to each other.

A clock generation circuit 11 inputs external clock signals CK and /CK and a clock enable signal CKE. The clock generation circuit 11 generates an internal clock signal required within the semiconductor device 1, and supplies the signal to each component.

To the command terminals /CS, /RAS, /CAS, and /WE, a chip select signal /CS, a row address strobe signal /RAS, a column address strobe signal /CAS, and a write enable signal /WE are supplied, respectively. These command signals are supplied to a command decoder 12. The command decoder 12 decodes the command signals received, and supplies them to the chip control circuit 13.

An operation mode of the semiconductor device 1 is set in a mode register 14. The chip control circuit 13 inputs the output of the command decoder 12 and the operation mode set in the mode register 14, and generates various control signals based thereon. The chip control circuit 13 supplies the various control signals generated to an array control circuit 15, a read/write amplifier (read/write amp) 16, a latch circuit 17, a data input/output buffer 18, a column address buffer 19, and a bank and row address buffer 20.

An address signal ADD includes a bank address specifying a bank, a row address specifying a word line WL, and a column address specifying a bit line (constituted by a global bit line GBL and a local bit line LBL). The bank and row addresses in the address signal ADD are supplied to the bank and row address buffer 20, and the column address is supplied to the column address buffer 19.

The bank and row address buffer 20 specifies a bank from the banks 0 to 7 and outputs a row address. Further, the row address outputted by the bank and row address buffer 20 is decoded by a row decoder 21, and a word line (WL) is selected according to this decoding.

The column address outputted by the column address buffer 19 is decoded by a column decoder 22, and a bit line corresponding to the column address is selected from a plurality of bit lines according to this decoding. A latch circuit (not shown in the drawings) in a memory cell array corresponding to the selected bit line is connected to the read/write amp 16 via an I/O line pair 89.

The read/write amp 16 is a read amplifier circuit and a write amplifier circuit connected to the data input/output terminal DQ which is an external terminal, via the latch circuit 17 and the data input/output buffer 18. The internal clock signal is supplied to the latch circuit 17 and the data input/output buffer 18 from the clock generation circuit 11, controlling the timing of data input/output between the memory cell array and the data input/output terminal DQ.

Next, the memory cell array 2 and the peripheral circuits thereof is described.

FIG. 1 is a block diagram of the memory cell array 2 and the peripheral circuits thereof.

The ECC function described above is realized by the ECC circuit constituted by a sense amplifier and ECC control circuit 34, the syndrome generating circuit 51, the decision circuit 52, and the syndrome decoder 53. The ECC circuit, the circuitry associated therewith, and the signal paths connecting them are illustrated in FIG. 1 for the sake of explanation, but these can be changed as appropriate without being limited thereto.

Further, during write and read operations, the command signal generated by the command decoder 12 is inputted to the chip control circuit 13. The chip control circuit 13 generates the control signals for controlling the read/write amp 16, the row decoder 21, the column decoder 22, pre-charge circuits 31-1, 31-2, and 31-3, selectors 32 and 33, and the sense amp and ECC control circuit 34 according to the command signal.

The address signals outputted by the column address buffer 19 and the bank and row address buffer 20 are sent to the pre-charge circuits 31-1 to 31-3, the row decoder 21, the selectors 32 and 33, and the column decoder 22. These circuits inputting the address signals select a memory cell included in the memory cell array 2 according to the address signals inputted.

The memory cell array 2 may include the data bit cell array 35-1, the check bit cell array 35-2, and a reference cell array 35-3.

The data bit cell array 35-1 may include a region including memory cells that store data supplied from the outside of the semiconductor device 1. In other words, the data bit cell array 35-1 may include a plurality of memory cells and may be configured to store data information.

The check bit cell array 35-2 may include a region including memory cells that store a check bit (ECC correction bit) for the data stored by the data bit cell array 35-1. In other words, the check bit cell array 35-2 may include a plurality of memory cells and may be configured to store error-correction information.

The reference cell array 35-3 may include a region including memory cells used when a reference signal, the size of which is compared to a read signal when data is read from a memory cell included in the data bit cell array 35-1 and the check bit cell array 35-2, is generated. Specifically, memory cells having an intermediate resistance value between resistance values corresponding to logical data "0" and "1" are included in the reference cell array 35-3. Or two memory cells having resistance values corresponding to the logical data "0" and "1" may be included in the reference cell array 35-3, and the reference signal may be generated from the intermediate value between these resistance values.

Further, in the description below, memory cells included in the data bit cell array 35-1, the check bit cell array 35-2, and the reference cell array 35-3 are referred to as data bit cells, check bit cells, and reference cells, respectively. Further, a page of the data bit cell array includes 512 bits. Moreover, the check bits for 512 bits corresponding to a page may be 10 bits.

In each region included in the memory cell array 2, a plurality of the data bit cells, the check bit cells, and the reference cells are selected, depending on a word line (WL) (not shown in the drawings) selected by the row decoder 21 according to an active command and row address supplied externally. 512 data bit cells selected from these cells by the selector 32 are connected to one of input ends of data bit sense amplifiers (SAD) 36-1 to 36-512 via a bit line (not shown in the drawings). Similarly, 10 check bits selected by the selector 33 are connected to one of input ends of check bit sense amplifiers (SAC) 37-1 to 37-10.

In the description below, the data bit sense amplifiers 36-1 to 36-512 are simply referred to as "the data bit sense amp 36" unless the data bit sense amplifiers 36-1 to 36-512 are particularly distinguished from each other. Similarly, the check bit sense amplifiers 37-1 to 37-10 are simply referred to as "the check bit sense amp 37" unless the check bit sense amplifiers 37-1 to 37-10 are particularly distinguished from each other.

The reference cells are connected to a reference signal generating circuit 38. The reference signal generating circuit 38 generates a reference signal based on a signal read from the reference cells. The reference signal generating circuit 38 supplies the generated reference signal to the other input ends of the data bit sense amp 36 and the check bit sense amp 37.

Here, signals read from the data bit cells and the check bit cells may be in a signal voltage or signal current form, and the reference signal may be supplied to the data bit sense amp 36 and the check bit sense amp 37 as a corresponding reference voltage or reference current. In the present embodiment, since a signal current form is used for the reference signal, the reference signal generated by the reference signal generating circuit 38 is referred to as reference current IREF.

Further, in the present embodiment, the reference current IREF is shared by the 522 sense amps (the data bit sense amp 36 and the check bit sense amp 37), but the supply mode of the reference signal is not limited thereto. For instance, the 522 sense amps may be divided into a plurality of blocks, and a plurality of reference signals are generated and supplied to each block.

The 512 data bits sense-amplified by the data bit sense amp 36 are written to data bit registers (RGD) 39-1 to 39-512. Similarly, the 10 check bits sense-amplified by the check bit sense amp 37 are written to check bit registers (RGC) 40-1 to 40-10. The data bit registers 39-1 to 39-512 are circuitry for temporarily holding data information. The check bit registers 40-1 to 40-10 are circuitry for temporarily holding the error-correction information.

In the description below, the data bit registers 39-1 to 39-512 are simply referred to as "the data bit register 39" unless the data bit registers 39-1 to 39-512 are particularly distinguished from each other. Similarly, the check bit registers 40-1 to 40-10 are simply referred to as "the check bit register 40" unless the check bit registers 40-1 to 40-10 are distinguished from each other.

Error Determination Operation

The data bits and the check bits written to each register are provided to the syndrome generating circuit 51. The syndrome generating circuit 51 calculates a 10-bit syndrome using the data bits and the check bits inputted. The syndrome generating circuit 51 relating to the present embodiment may generate a syndrome using a Hamming code capable of correcting a one-bit error. However, the syndrome generated by the syndrome generating circuit 51 is not limited thereto.

The syndrome generating circuit 51 outputs the calculation result to the decision circuit 52. When all the bits in the 10-bit syndrome inputted to the decision circuit 52 are "0," it is determined that no error exists in the 512 data bits and the 10 check bits read out. On the other hand, when there is at least one "1" bit in the 10-bit syndrome, it is determined that an error exists in the 512 data bits and the 10 check bits read out.

In this case, the decision circuit 52 instructs the syndrome decoder 53 to correct the error. Specifically, the syndrome decoder 53 decodes the 10-bit syndrome, and identifies a register corresponding to the bit with an error.

The syndrome decoder 53 performs error correction by inverting the data stored by the identified register. Specifically, by supplying an inversion control signal INV to the data bit register 39 where an error is identified, the syndrome decoder 53 instructs the register to invert the data held therein. Further, the inversion control signal INV is a signal supplied to each data bit register 39.

Further, in the description below, a function module constituted by the syndrome generating circuit 51, the decision circuit 52, and the syndrome decoder 53 is referred to as ECC circuit block 50. The ECC circuit block 50 is circuitry for performing error correction based on data information read from the memory cell array or data information written from the outside.

The sense amp and ECC control circuit 34 executes comprehensive control over the data bit sense amp 36, the check bit sense amp 37, and the ECC circuit block 50. Specifically, the sense amp and ECC control circuit 34 generates a read pulse signal RP and write pulse signal /WP according to a control signal supplied by the chip control circuit 13. These signals will be described in detail later.

When the error correction by the ECC circuit block 50 is completed, the semiconductor device 1 transitions to an access period in a page mode.

Normal Operation

During the access period, the semiconductor device 1 responds to read/write commands and a column address supplied externally, and reads/writes from/to at least one of the data bit registers 39-1 to 39-512 to be accessed. Then, the semiconductor device 1 responds to a pre-charge command supplied externally, and the data held by the data bit registers 39-1 to 39-512 is written to the data bit cells.

The Operation of Generating the Error-Correction Information

When a write command is externally supplied (when data is written to the memory cells), the syndrome generating circuit 51 generates check bits while the access is made to the memory cells and the generated check bits are written to the check bit register 40. Then, the check bits held by the check bit register 40 are written to the check bit cells according to a data writing method described later. Further, data is written to the data bit cells and the check bit cells by having write control circuits 71 and 73 (that will be described later) drive the global bit line GBL.

Writing the Normal Information

Data bit write circuits (WDD) 41-1 to 41-512 are circuitry for writing data held by the corresponding register to the memory cells. The data bit write circuits (WDD) 41-1 to 41-512 write data supplied externally to the data bit cell array 35-1.

Writing the Error-Correction Information

Check bit write circuits (WDC) 42-1 to 42-10 are circuitry for writing data held by the corresponding register to the memory cells. The check bit write circuits (WDC) 42-1 to 42-10 may write the error-correction information generated by the ECC circuit to the check bit cell array 35-2.

In an embodiment, the ECC control circuit 34 may be configured to write an updated portion, which has been updated, of information held by the data bit registers 39 to memory cells of the first memory cell array and be free from writing a remaining portion of the information held by the data bit registers 39 to memory cells of the first memory cell array.

In an embodiment, the semiconductor device 1 may also include a plurality of first latch circuits that correspond to the first memory array and hold the normal information, the first latch circuits being different from the first and second register circuits. The control circuit 34 may be configured to write, when normal information held by the first latch circuit is different from write normal information externally provided, a portion of the write normal information to a memory cell of the first memory cell array and be free from writing a remaining portion of the write normal information to a memory cell of the first memory cell array.

In an embodiment, the semiconductor device 1 may further include a plurality of second latch circuits that correspond to the second memory array and hold the error-correction information that have been read from memory cells of the second memory cell array, the second latch circuits being different from the first and second register circuits. The control circuit 34 may be configured to write, when error-correction information held by the second latch circuits differs from new error-correction information that has been newly generated from the write normal information, a portion of the new error-correction information to a memory cell of the second memory cell array and be free from writing a remaining portion of the new error-correction information to a memory cell of the second memory cell array.

Further, in the description below, the data bit write circuits 41-1 to 41-512 are simply referred to as "the data bit write circuit 41" unless the data bit write circuits 41-1 to 41-512 are particularly distinguished from each other. Similarly, the check bit write circuits 42-1 to 42-10 are simply referred to as "the check bit write circuit 42" unless the check bit write circuits 42-1 to 42-10 are particularly distinguished from each other. The details of the data bit write circuit 41 and the check bit write circuit 42 will be described later, but these circuits are constituted by including a driver that drives the global bit line GBL.

Next, the configurations of a pre-charge circuit, memory cell array, and selector, and the connections therebetween will be described.

Figure 3:
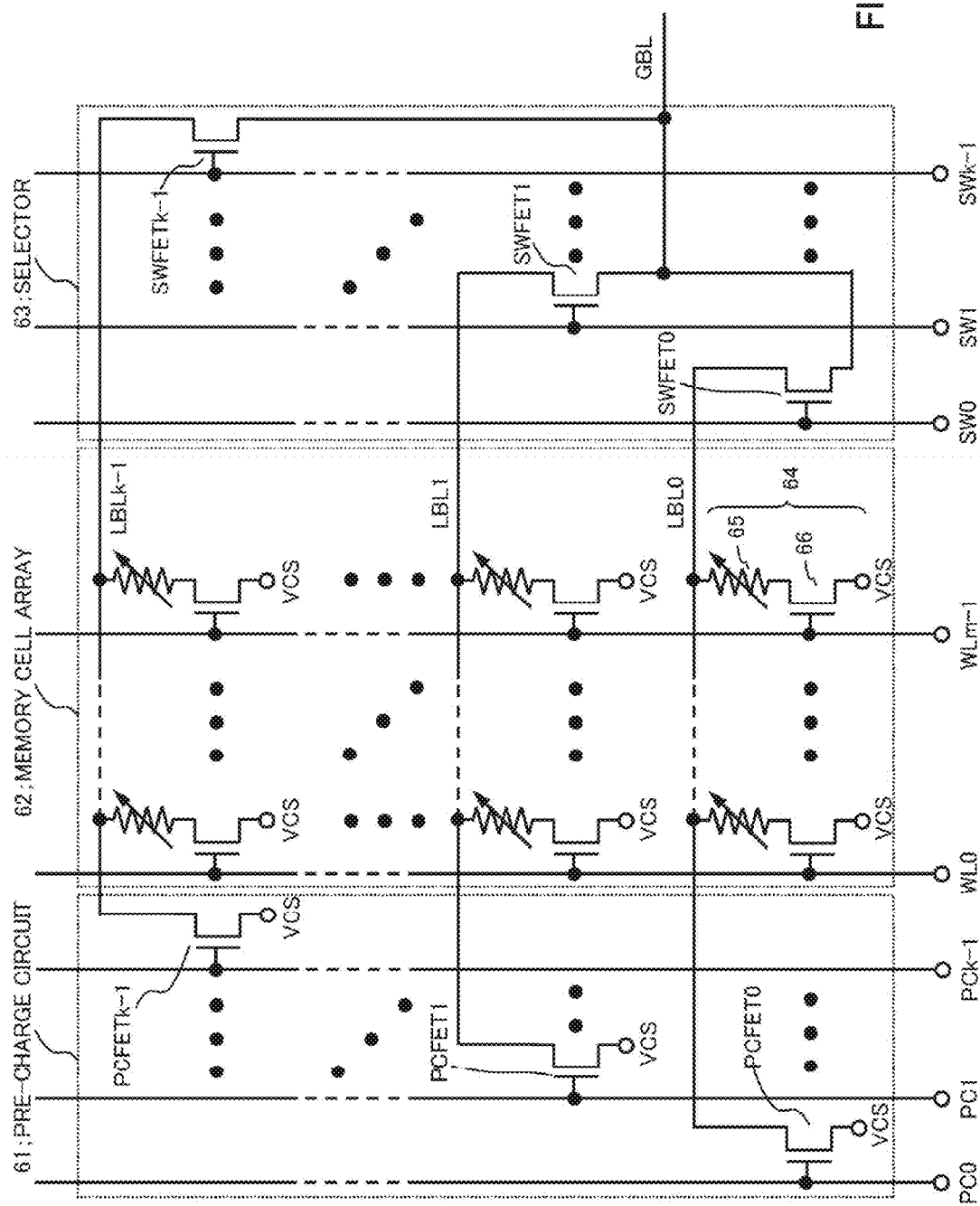
FIG. 3 is a drawing showing an example of an internal configuration and connections of a pre-charge circuit 61, a memory cell array 62, and a selector 63.

FIG. 3 shows an example of an internal configuration and connections of a pre-charge circuit 61, a memory cell array 62, and a selector 63.

The pre-charge circuit 61 is a part of the pre-charge circuit 31-1 or 31-2. Similarly, the memory cell array 62 is a part of the data bit cell array 35-1 or the check bit cell array 35-2. The selector 63 is a part of the selectors 32 or 33.

With reference to FIG. 3, the memory cell array 62 includes m word lines WL0 to WLm−1 (m is a positive integer; hereinafter the same), k local bit lines LBL0 to LBLk−1 (k is a positive integer; hereinafter the same), and m×k memory cells 64 arranged at intersections thereof. The memory cell 64 includes a magnetic tunnel junction element 65 and a selection transistor 66.

As shown in FIG. 3, each of the memory cells 64 is connected between a first terminal (for instance, an end connected to a power line supplying the common source voltage VCS) and a second terminal (for instance, an end connected to the wiring of the local bit line LBL). Further, each of the memory cells 64 is written to a first resistance state (for instance, a low resistance state) by applying a first current in a first direction between the first and second terminals, and written to a second resistance state (for instance, a high resistance state) by applying a second current in a second direction opposite to the first direction between the first and second terminals.

The pre-charge circuit 61 includes k pre-charge transistors PCFET0 to PCFETk−1. Each of the pre-charge transistors PCFET included in the pre-charge circuit 61 receives the corresponding pre-charge signals PC0 to PCk−1 at gates thereof. Each of the pre-charge transistors PCFET is for pre-charging the local bit line LBL to the common source voltage VCS when the pre-charge signal PC connected to the gate is controlled to a high level.

When one local bit line LBL is selected, the selected local bit line LBL is cut off from the power line supplying the common source voltage VCS by controlling only the pre-charge signal PC corresponding to the selected local bit line LBL to a low level.

The selector 63 includes k connected transistors SWFET0 to SWFETk−1. Each of the connected transistors SWFET included in the selector 63 receives the corresponding connection signals SW0 to SWk−1 at gate thereof. Each of the connected transistors SWFET is for cutting off each local bit line LBL from the global bit line GBL by having the connection signal SW controlled to a low level when the semiconductor device 1 is in a pre-charge state.

When one local bit line LBL is selected, the selected local bit line LBL is connected to the global bit line GBL by controlling only the connection signal SW corresponding to the selected local bit line LBL to a high level. In a state in which one word line WL is selected and activated, the selected local bit line LBL is cut off from the common source voltage VCS and connected to the global bit line GBL. Further, the remaining, unselected local bit lines LBL continue to be pre-charged to the common source voltage VCS.

One memory cell 64 connected to the selected word line (WL) and the selected local bit line (LBL) has a main terminal (source or drain) of the selection transistor 66 connected to the common source voltage VCS and an end of the magnetic tunnel junction element 65 connected to the local bit line LBL and the global bit line GBL. Meanwhile, since the k−1 remaining memory cells 64 connecting to the selected word line WL and the unselected local bit lines LBL have both ends connected to the common source voltage VCS, no voltage is applied to the magnetic tunnel junction element 65 even when the selection transistor 66 turns on. As a result, since no current flows through the magnetic tunnel junction element 65, data stored in the memory cell 64 will not get corrupted.

Figure 4:
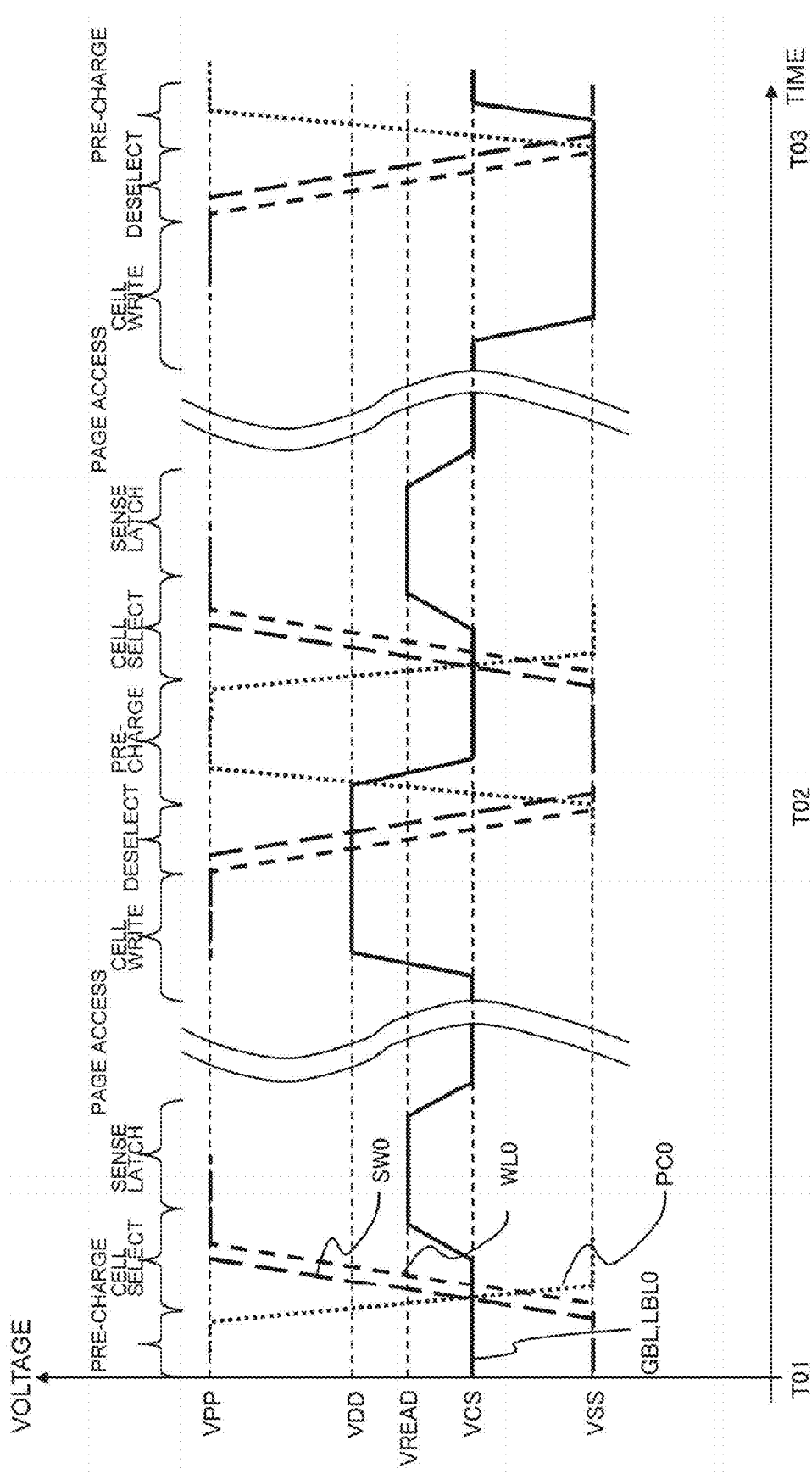
FIG. 4 is a drawing showing an example of the operation waveform of each signal when a word line WL0 and a local bit line LBL0 are selected.

FIG. 4 shows an example of the operation waveform of each signal when the word line WL0 and the local bit line LBL0 are selected.

During a period from time T01 to time T02 in FIG. 4, data "0" corresponding to a high resistance state is read in response to an active command as described later, and then after a page access period, data "1" corresponding to a low resistance state is written in response to a pre-charge command.

The Operation of Reading Data "0" During a pre-charge period, the pre-charge signals PC0 to PCk−1 are controlled to a voltage VPP, and the connection signals SW0 to SWk−1 and the world lines WL0 to WKm−1 are controlled to a voltage VSS. Further, the local bit line LBL is pre-charged to the common source voltage VCS, and the global bit line GBL is pre-charged to the common source voltage VCS by GBL drivers 72 and 74, described later.

During a cell select period thereafter, the local bit line LBL0 is connected to the global bit line GBL by controlling the pre-charge signal PC0 to the voltage VSS, and the connection signal SW0 and the word line WL0 to the voltage VPP. At this time, before the start of a sense latch period, the potentials of the global bit line GBL and the local bit line LBL0 are set to and held at a read voltage VREAD, and a read current IREAD0 flows through the memory cell.

The read current IREAD0 has a small current value corresponding to the memory cell in a high resistance state and is smaller than the current value of the reference current IREF.

During the sense latch period thereafter, the current difference between the read current IREAD0 and the reference current IREF is sense-amplified by the sense amp, and data "0" is held in the data bit register 39. Further, during the sense latch period, the potentials of the global bit line GBL and the local bit line LBL0 are substantially maintained at the read voltage VREAD.

At the end of the sense latch period, the potentials of the global bit line GBL and the local bit line LBL0 become the common source voltage VCS. The semiconductor device 1 transitions to the page access period thereafter.

During the page access period, in response to a read command, data is read from the data bit register 39. Or in response to a write command, data is written to the data bit register 39. Page access is performed on the data bit register 39, the potential of the global bit line (GBL) is held at the common source voltage VCS, and the state of each control signal does not change. In other words, during the page access period, no access is made to the memory cells.

In the present embodiment, the data in the data bit register 39 written by column access and all the check bit data are written to the memory cells in response to a pre-charge command, as described later.

The Operation of Writing Data "1"

During a cell write period, in response to writing of data "1," the data bit write circuit 41 drives the potentials of the global bit line (GBL) and the local bit line LBL0 to a voltage VDD, and writes the data "1" to the data bit cells.

During a select release period thereafter, the word line WL0 and the connection signal SW0 are controlled to the voltage VSS. Further, a control method for writing a check bit to the check bit cell will be described later.

During the pre-charge period thereafter, the pre-charge signals PC0 are controlled to the voltage VPP, and the potential of the local bit line LBL0 is pre-charged to the common source voltage VCS. Further, the potential of the global bit line (GBL) is pre-charged to the common source voltage VCS by the data bit write circuit 41 and the check bit write circuit 42.

During a period from time T02 to time T03 as shown in FIG. 4, data "1" corresponding to a low resistance state is read in response to an active command, and then after the page access period, data "0" corresponding to a high resistance state is written in response to a pre-charge command. Since the operation from the pre-charge period to the cell select period during a period from the time T02 to the time T03 as shown in FIG. 4 is the same as the operation of reading data "0," the explanation will be omitted.

The Operation of Reading Data "1"

When data "1" is read, before the start of the sense latch period, the potentials of the global bit line GBL and the local bit line LBL0 are set to and held at the read voltage VREAD, and a read current IREAD1 flows through the memory cell. The read current IREAD1 has a large current value corresponding to the memory cell in a low resistance state and is larger than the current value of the reference current IREF.

During the sense latch period, the current difference between the read current IREAD1 and the reference current IREF is sense-amplified by the sense amp, and data "1" is held in the data bit register 39. During this sense latch period, the potentials of the global bit line GBL and the local bit line LBL0 are substantially maintained at the read voltage VREAD. At the end of the sense latch period, the potentials of the global bit line GBL and the local bit line LBL0 become the common source voltage VCS.

The semiconductor device 1 transitions to the page access period thereafter. Since the operation at this time is the same as the operation of reading data "0," the explanation will be omitted.

The Operation of Writing Data "0"

During the cell write period corresponding to a pre-charge command, in response to writing data "0," the data bit write circuit 41 drives the potentials of the global bit line GBL and the local bit line LBL0 to the voltage VSS, and writes the data "0" to the data bit cells. Since the operation from the select release period to the pre-charge period thereafter is the same as the operation of reading data "0," the explanation will be omitted.

Figure 5:
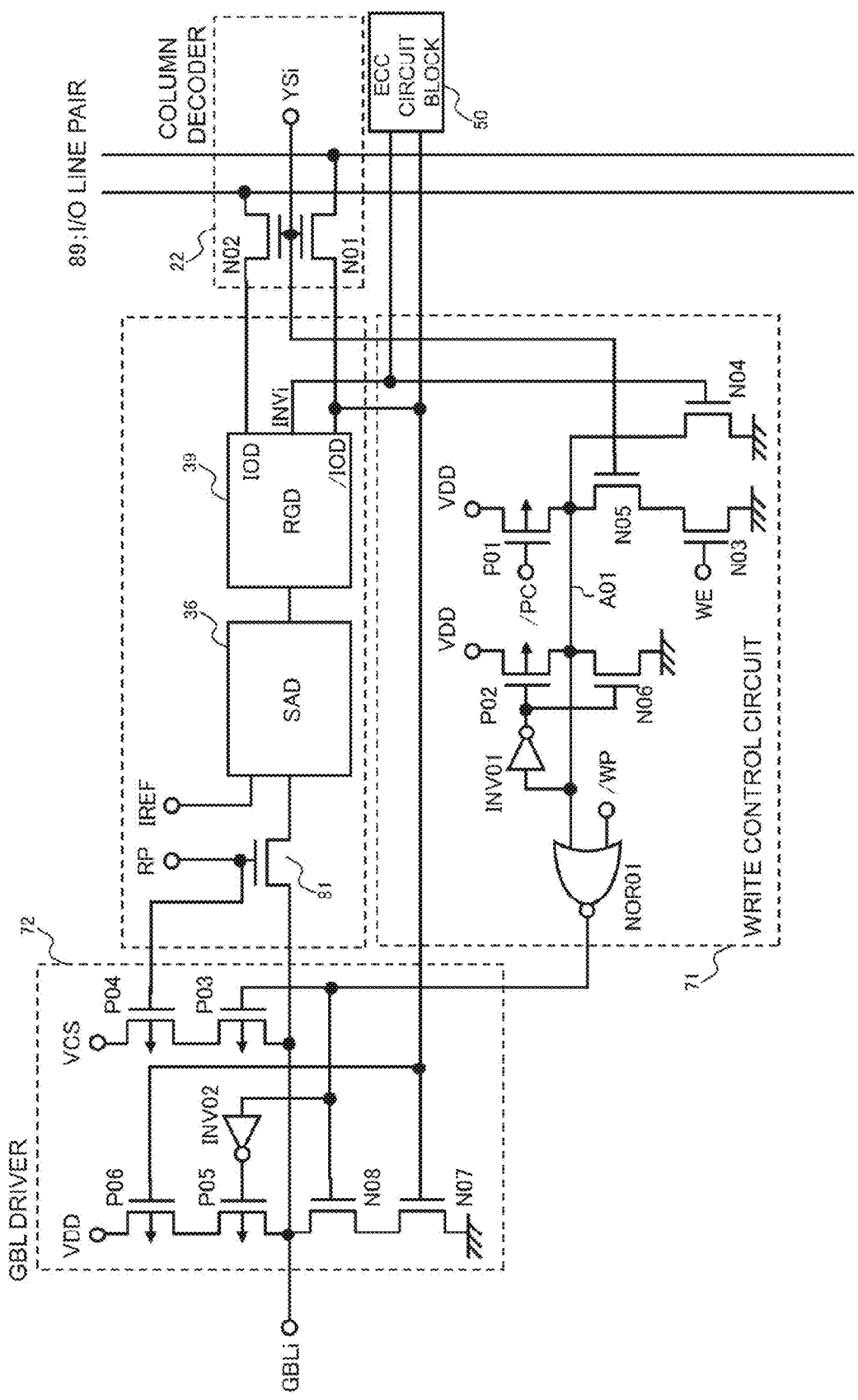
FIG. 5 is a drawing showing an example of the configurations of main circuits used for reading/writing data bits.

FIG. 5 shows an example of the configurations of main circuits used for reading/writing data bits.

A suffix "i" in FIG. 5 corresponds to any value from 1 to 512 in FIG. 1.

With reference to FIG. 5, to access the data bit cell, the ECC circuit block 50, the column decoder 22, the data bit sense amp 36, the data bit register 39, the write control circuit 71, and the GBL driver 72 are used. Further, the write control circuit 71 and the GBL driver 72 are circuits included in the data bit write circuit 41.

The ECC circuit block 50 as shown in FIG. 5 corresponds to the ECC circuit as shown in FIG. 1, e.g., including the sense amp and ECC control circuit 34, the syndrome generating circuit 51, the decision circuit 52, and the syndrome decoder 53. Specifically, an INVi line connected between the data bit register (RGD) 39 and the ECC circuit block 50 as shown in FIG. 5 corresponds to the signal line (one line out of 512 lines) between the data bit register RGD 39 and the syndrome decoder 53 as shown in FIG. 1. A signal line connected between /IOD of the data bit register (RGD) 39 and the ECC circuit block 50 as shown in FIG. 5 corresponds to the signal line connecting the data bit register (RGD) to the syndrome generating circuit 51 through the column decoder 22 as shown in FIG. 1.

The Operation of the Circuits Associated with the Data Bit

In a state in which a data bit cell is selected by the word line WL and the local bit line LBL, when the read pulse signal RP is controlled to a high level, an N-channel MOS transistor 81 becomes conductive. As a result, the global bit line GBL and the data bit sense amp 36 are connected, and the data bit sense amp 36 compares the read current IREAD flowing through the global bit line GBL to the current value of the reference current IREF, and outputs read data corresponding to the difference thereof. The data bit register 39 latches the outputted read data and exchanges data with the outside via an input/output terminal IOD and an inverting input/output terminal /IOD.

The column decoder 22 includes N-channel MOS transistors N01 and N02 corresponding to each of the global bit lines GBL. The N-channel MOS transistors N01 and N02 receive a Y-switch selection signal YS at gates thereof, and selectively connect the input/output terminal IOD and the inverting input/output terminal /IOD of the data bit register 39 to the I/O line pair 89. Input/output of data is performed between the data bit register 39 selected by the Y-switch selection signal YS and the outside. Further, the Y-switch selection signal YS is a signal obtained by having the column decoder 22 decode a column address.

Further, the inverting input/output terminal /IOD of the data bit register 39 is also connected to the ECC circuit block 50. The ECC circuit block 50 performs syndrome calculation, error determination, and syndrome decoding based on data supplied from the inverting input/output terminal /IOD. Further, at the data bit register 39 in which an error is detected, the data stored is inverted by the corresponding inversion control signal INV.

The write control circuit 71 is a circuit included in the data bit write circuit 41 and constituted by including four N-channel MOS transistors, two P-channel MOS transistors, an inverter circuit INV01, and a NOR circuit NOR01.

The write control circuit 71 controls so that only the following two types of data are written to the data bit cell during the write period in response to a pre-charge command.

The first data is the data held by the data bit register 39 and corrected by the ECC circuit block 50.

The second data is the data selected by the Y-switch selection signal YS during the page access period and held by a data bit register 39 that has been written to.

More concretely, when the inversion control signal INV is controlled to a high level by the ECC circuit block 50 to correct an error (the first data), a node A01 changes to a low level. Or when an inversion write enable signal WE is controlled to a high level and the Y-switch selection signal YS selected by a column address is controlled to a high level due to the fact that a write command is supplied during the page access period (the second data), the node A01 changes to a low level. Note that the node A01 is a connection node between the P-channel MOS transistors P01 and P02, and the N-channel MOS transistors N05 and N06 as shown in FIG. 5.

When transitioning to the cell write period in response to a pre-charge command, the write control circuit 71 drives the GBL driver 72 due to the fact that the write pulse signal /WP is controlled to a low level. The GBL driver 72 includes two N-channel MOS transistors, four P-channel MOS transistors, and an inverter circuit INV02. The GBL driver 72 drives the global bit line GBL to the voltage VDD or VSS according to data outputted from the inverting input/output terminal /IOD, and writes the data to the data bit cell. In other words, a data bit is written to the data bit cell independently to the generation of the check bit by the ECC circuit block 50.

By the control described above, out of the 512 data bit registers 39 (a page's worth), a register that has been written to and a register that has been error-corrected become the targets of a cell write operation. In other words, out of the data held by the data bit registers 39-1 to 39-512, the data updated by data externally supplied and the data error-corrected by the ECC circuit block 50 are written to the memory cell included in the data bit cell array 35-1. As a result, out of the 512 data bit cells (a page's worth), the number of the data bit cells actually written and through which a write current flows is reduced, and thus decreases the power consumption of the semiconductor device 1.

Further, since a write is performed only on the data held by the data bit register 39 during the page access period, the cycle time of column access will not increase even if an STT-RAM memory cell having relatively a long write time is used. The circuit area used for performing the control described above (the area of each circuit shown in FIG. 5) increases when compared to, for instance, a sense amplifier such as DRAM (Dynamic Random Access Memory). However, as shown in FIG. 3, since the wiring pitch density of the global bit line GBL is relaxed substantially with respect to the wiring pitch of the local bit line LBL, the wiring pitch of the circuits connected to these bit lines is relaxed, compared to DRAM circuitry. Therefore, the layout of each circuit shown in FIG. 5 can be accomplished more easily, with fewer circuits and a smaller chip area, compared to DRAM circuitry.

Figure 6:
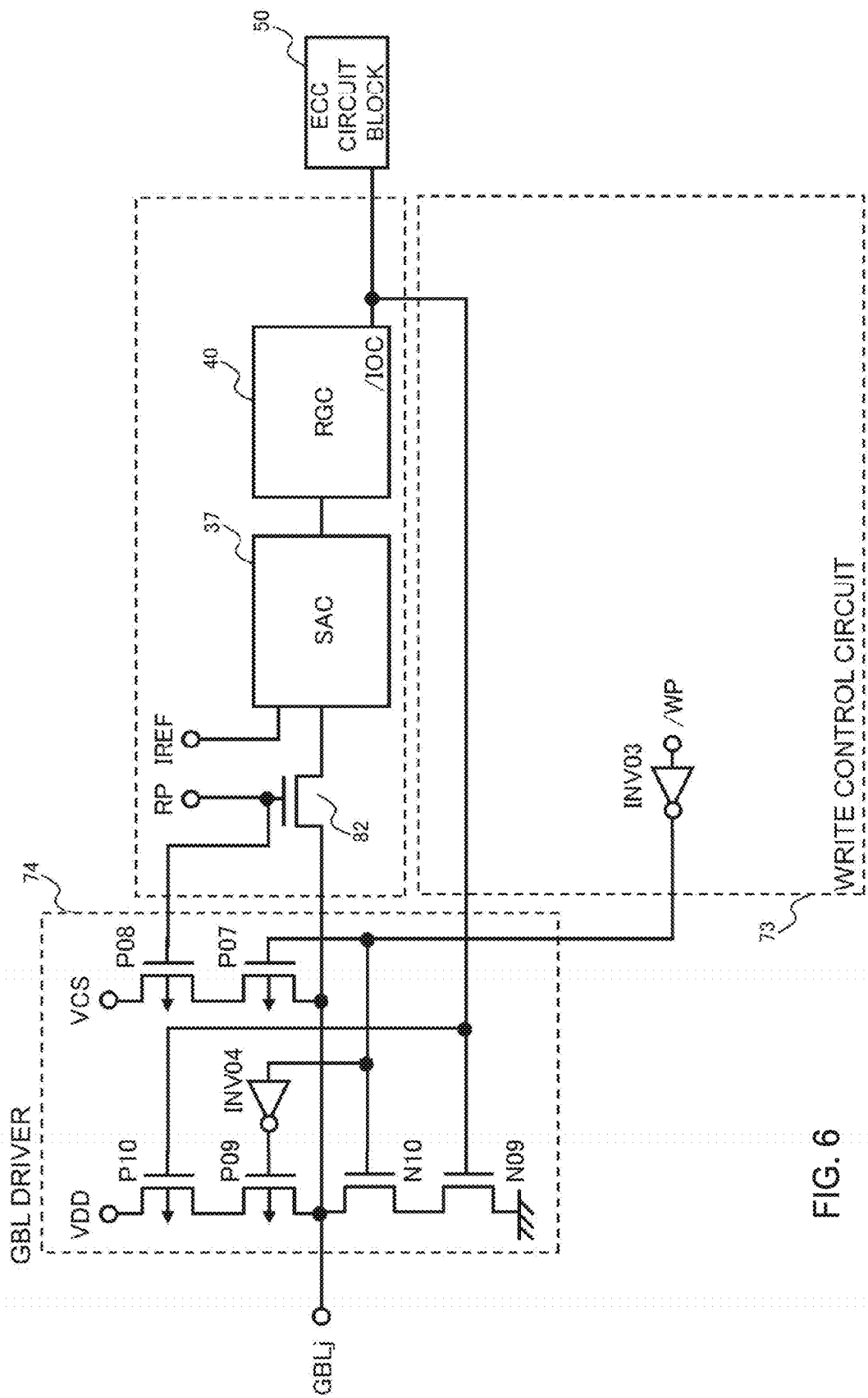
FIG. 6 is a drawing showing an example of the configurations of main circuits used for reading/writing check bits.

FIG. 6 shows an example of the configurations of main circuits used for reading/writing the check bits. Note that a suffix "j" in FIG. 6 corresponds to any value from 1 to 10 in FIG. 1.

With reference to FIG. 6, to access the check bit cell, the ECC circuit block 50, the check bit sense amp 37, the check bit register 40, the write control circuit 73, and the GBL driver 74 are used. Further, the write control circuit 73 and the GBL driver 74 may be circuits included in the check bit write circuit 42.

The ECC circuit block 50 as shown in FIG. 6 corresponds to the ECC circuit as shown in FIG. 1, i.e., the sense amp and ECC control circuit 34, the syndrome generating circuit 51, the decision circuit 52, and the syndrome decoder 53. Specifically, a signal line connected between the check bit register (RGC) 40 and the ECC circuit block 50 as shown in FIG. 6 corresponds to the signal line between the check bit register (RGC) 40 and the syndrome generating circuit 51 as shown in FIG. 1.

The Operation of the Circuits Associated with the Check Bit

Since the operation of reading data from the check bit cell by the circuits as shown in FIG. 6 is the same as the content of the description referring to FIG. 5, the explanation will be omitted. Since the check bit is recalculated before being written to the check bit cell, the error correction performed on the data bit register 39 is not performed. Because of this, each circuit as shown in FIG. 6 continues to be in a read state during the page access period.

The write control circuit 73 includes an inverter circuit INV03 and controls so that a check bit is written to the check bit cell during the cell write period in response to a pre-charge command. More concretely, as the write pulse signal /WP is controlled to a low level, the write control circuit 73 drives the GBL driver 74 during the cell write period in response to a pre-charge command.

The GBL driver 74 includes two N-channel MOS transistors, four P-channel MOS transistors, and the inverter circuit INV02. The GBL driver 74 drives the global bit line GBL to the voltage VDD or VSS according to data outputted by an inverting input/output terminal /IOC.

Here, a thermal-assist-current flows through the check bit cell in a direction determined based on the data stored in the corresponding check bit register (RGC) 40. Further, in parallel, the ECC circuit block 50 generates check bits corresponding to write data (data held by the data bit register 39) externally supplied, and supplies the new check bits to the inverting input/output terminal /IOC.

The direction of the thermal-assist-current may be (i) the same in all the memory cells, or (ii) different for each cell (i.e., the direction of writing "0" in a cell A, and the direction of writing "1" in another cell B). This is because subsequent cell writes (spin inversion/non-inversion) can be performed in a short period of time when the cell temperature rises, as long as the temperature of the MTJ element increases due to the Joule heat generated by this current. In Example 1 described above, the (ii) method that can be controlled more easily is employed. For instance, when the check bit register (RGC) 40 holds a logical value "1," the local bit line LBL is biased to the voltage VDD and the thermal-assist-current flows from the local bit line LBL to the common source VCS. On the other hand, when the check bit register RGC 40 holds a logical value "0," the local bit line LBL is biased to the voltage VSS and the thermal-assist-current flows from the common source VCS to the local bit line LBL.

When the data (the check bit) is supplied to the inverting input/output terminal /IOC, the GBL driver 74 switches from driving the thermal-assist-current to a write current. In other words, when read data and write data are different from each other, the direction of the write current is inverted. Since the inverted write of the check bit is after the generation of the new check bit, it is later than the start of the data bit write, but the write time is reduced due to the thermal assist as described above. It is possible to flow the assist current, even when the assist current is applied in either direction, before the actual check bit is started to be written to the corresponding cell. Consequently, the write processing time of the check bit can be reduced.

Figure 7:
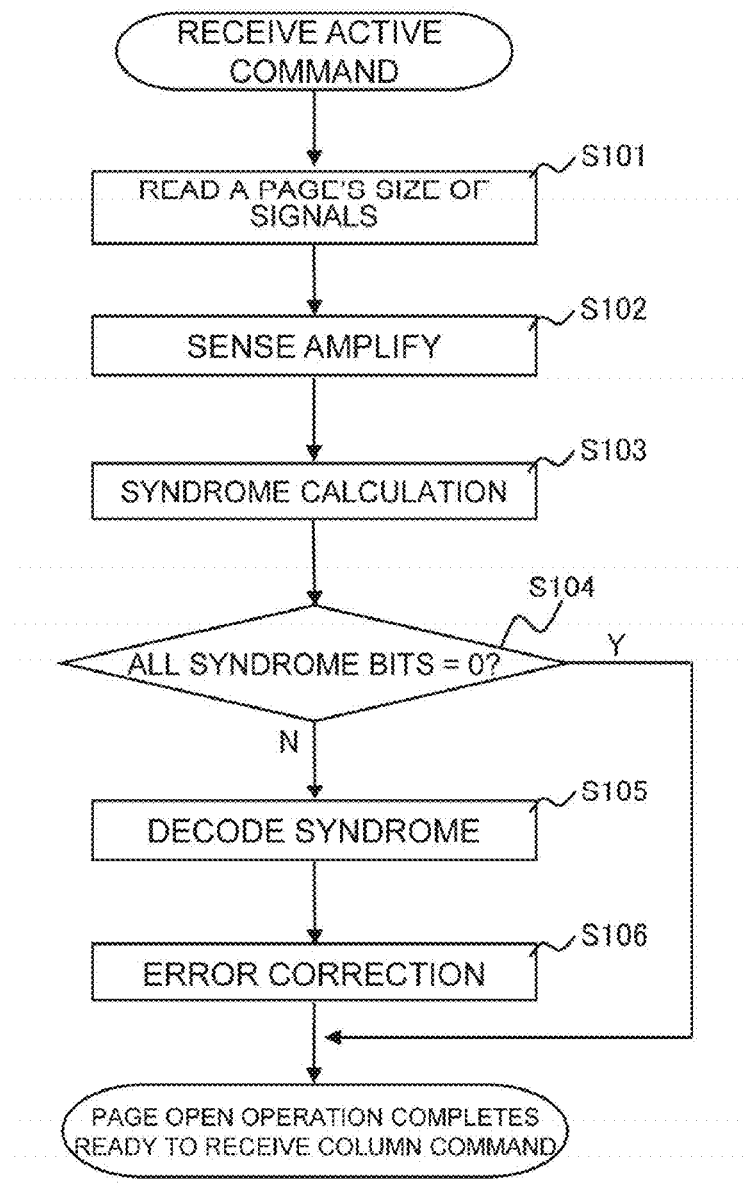
FIG. 7 is a flowchart showing an example of ECC control after an active command is received.

The ECC control after the semiconductor device 1 receives an active command is summarized in a flowchart as shown in FIG. 7.

FIG. 7 is a flowchart showing an example of the ECC control after an active command is received.

In step S101, a page's worth of signals from the data bit cells and the check bit cells are read, and the reference signals are read from the reference cells.

In step S102, the reference current IREF generated from the signals read from the reference cells is referred, and the signals read from the data bit cells and the check bit cells are sense-amplified by the corresponding sense amps.

In step S103, a page's worth of the data bits and the check bits are held by the corresponding registers, and syndrome calculation is performed using this information.

In step S104, whether or not the bits of the calculated syndrome are all "0" is determined.

When all the syndrome bits are "0" (Yes in the step S104), the processing as shown in FIG. 7 ends.

If "1" exists in the syndrome bits (No in the step S104), a process of step S105 and thereafter will be performed. In the step S105, the syndrome is decoded. In step S106, the error in the data bits and the check bits held by the data bit register 39 are corrected.

Figure 8:
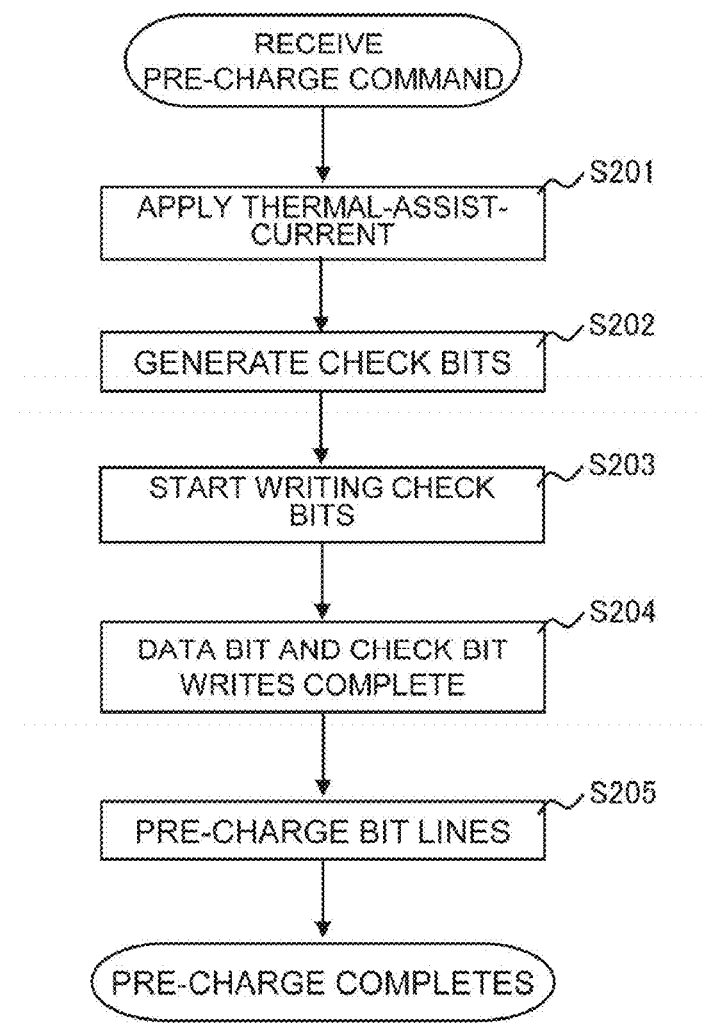
FIG. 8 is a flowchart showing an example of ECC control after a pre-charge command is received.

The ECC control after the semiconductor device 1 receives a pre-charge command is summarized in a flowchart as shown in FIG. 8.

FIG. 8 is a flowchart showing an example of the ECC control after a pre-charge command is received.

In step S201, a data bit write starts, and in parallel, a thermal-assist-current is applied to the check bit cells.

In step S202, the check bits are generated from the data bits. In step S203, the check bits are started to be written. In step S204, the data bits and the check bits have been written to the corresponding memory cells. In step S205, the word lines WL are deactivated and the bit lines are pre-charged.

Next, the operation of the semiconductor device 1 relating to the first embodiment will be described.

Figure 9:
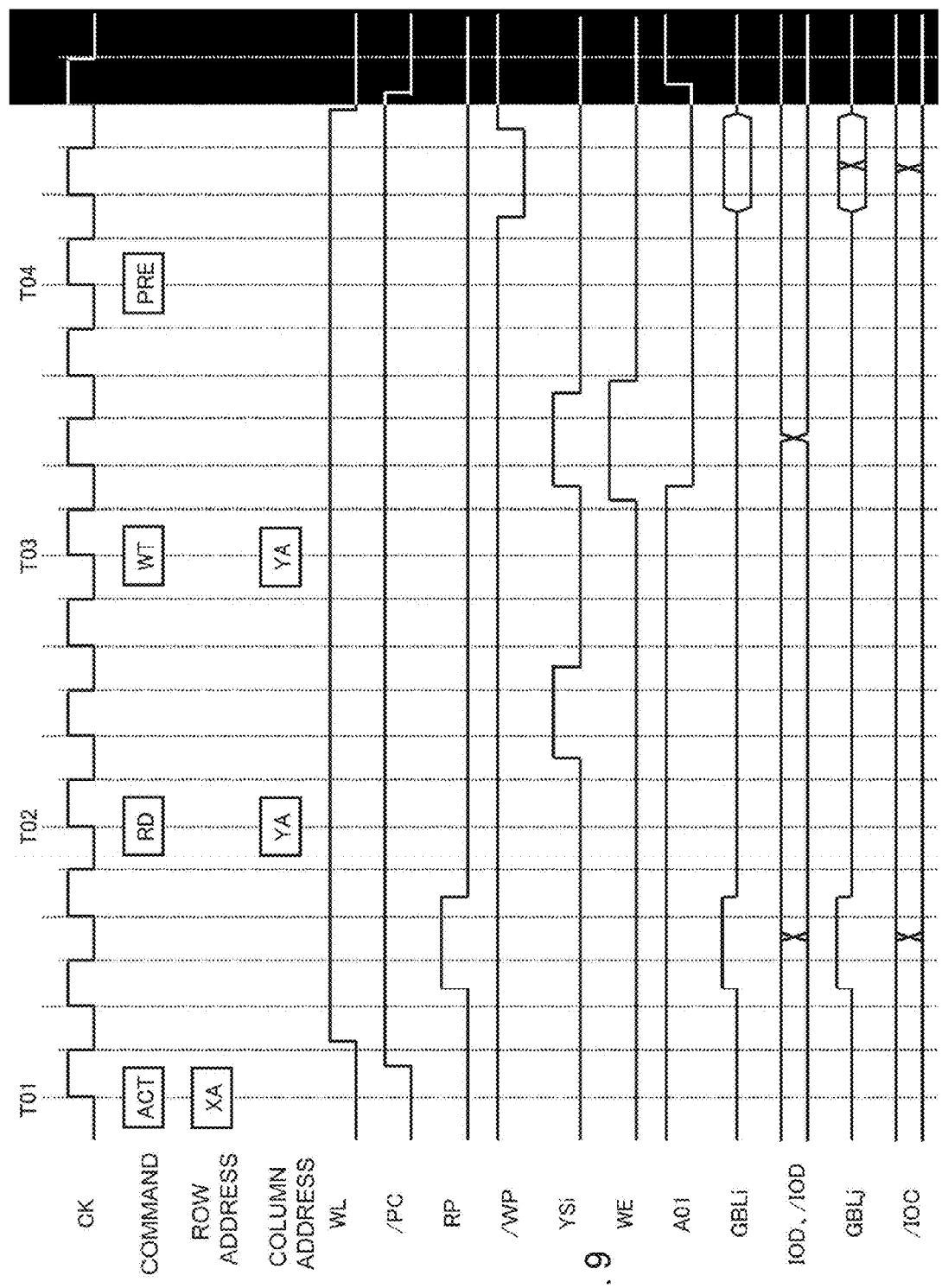
FIG. 9 is a drawing showing an example of the operation waveforms of the semiconductor device 1.

FIG. 9 shows an example of the operation waveforms of the semiconductor device 1.

At the time T01 when an active command ACT and a row address XA are inputted, an inverting pre-charge signal /PC of the write control circuit 71 and an inverting pre-charge /PC signal (not shown in the drawing) corresponding to the row address XA are controlled to be at a high level and a low level, respectively. Then, the word line WL selected by the row address XA is controlled to be at a high level (the voltage VPP).

Then, when the read pulse signal RP is controlled to be at a high level for a predetermined period of time, the potential of the global bit line GBL is driven from the common source voltage VCS to the read voltage VREAD and the read current IREAD flows through the global bit line GBL. Data at the input/output terminal IOD and the inverting input/output terminal /IOD and data at the inverting input/output terminal /IOC are updated according to the read data due to the fact that this read current IREAD is sense-latched.

Further, when the ECC circuit block 50 corrects an error, the inversion control signal INV (not shown in the drawing) is controlled to be at a high level for a predetermined period of time and data at the input/output terminal IOD and the inverting input/output terminal /IOD of the corresponding data bit register 39 are inverted.

At the time T02 when the page access period starts and a read command RD and a column address YA are inputted, the Y-switch selection signal YSi is controlled to be at a high level for a predetermined period of time in response to the column address YA and data at the input/output terminal IOD and the inverting input/output terminal /IOD are read to the I/O line pair 89.

At the time T03 when a write command WT and the column address YA are inputted, the write enable signal WE is controlled to be at a high level for a predetermined period of time and the Y-switch selection signal YSi is controlled to be at a high level for a predetermined period of time. As a result, data at the input/output terminal IOD and the inverting input/output terminal /IOD are inversely written from the I/O line pair 89. At this time, during the period when the Y-switch selection signal YSi is at the high level and the inversion write enable signal WE is at the high level, the node A01 transitions to a low level.

At time T04 when a pre-charge command PRE is inputted, a cell write operation starts, and when the write pulse signal /WP is controlled to be at a low level for a predetermined period of time thereafter, the global bit line GBLi is driven to a high or low level and inverted data is written to the data bit cell. Further, the global bit line GBLj corresponding to the check bit is also driven to a high or low level according to the data stored in the check bit cell and a thermal-assist-current flows. In other words, the control circuits (for instance, the sense amp and ECC control circuit 34 and the write control circuit 71 and 73) apply a third current different from first and second currents between first and second terminals to which the memory cell included in the check bit cell array 35-2 is connected during the period when the ECC circuit block 50 generates the error-correction information based on data information (the correction information generation period).

After the check bit has been generated, according to this data, the global bit line GBLj maintains its current state or is inversely driven and the new check bit data is written to the check bit cell. Then, the word line WL is controlled to be at a low level, the inverting pre-charge signal /PC is controlled to be at a low level thereafter, and with the node A01 pre-charged to a high level, a series of the page access operation completes.

Further, in addition to being supplied externally, a pre-charge command may be automatically issued by a read or write command accompanied by a pre-charge operation after the completion of a read or write operation. In these cases, the semiconductor device 1 performs the same operation as the case where a pre-charge command is supplied externally.

As described above, in the semiconductor device 1 relating to the first embodiment, before data written to the memory cell is determined, a current for thermal assistance (third current) is supplied to the memory cell to be written in a direction in which the same data as read data is written, and when the write data is determined, a write current (first or second current) is supplied to the memory cell in a direction corresponding to the write data. In more detail, in an STT-RAM having an on-chip ECC function, when data relating to the check bit is written to a memory cell, a thermal-assist-current is supplied to the memory cell to be written, utilizing the period during which the check bit is generated. As a result, the time for writing the check bit to the memory cell is reduced, and a high-speed STT-RAM can be realized.

Further, supplying a thermal-assist-current for preheating in the same direction as the direction in which the data already stored in the memory cell is written may prevent the memory cell data from being corrupted even when a thermal assist and data write is interrupted in a case where the same data is written, such as a second exemplary embodiment described later. In other words, the semiconductor device 1 contributing to the reduction of the data write time while preventing the inversion of stored data can be provided.

Embodiment 2

Next, the second embodiment will be described in detail with reference to the drawings.

Since the semiconductor device 1 relating to the first embodiment and a semiconductor device 1a relating to the second embodiment are the same in terms of overall configuration, the explanation on FIGS. 1 to 3 regarding the semiconductor device 1a will be omitted.

The difference between the semiconductor device 1a and the semiconductor device 1 is on the circuit configurations of write control circuits 71a and 73a.

Figure 10:
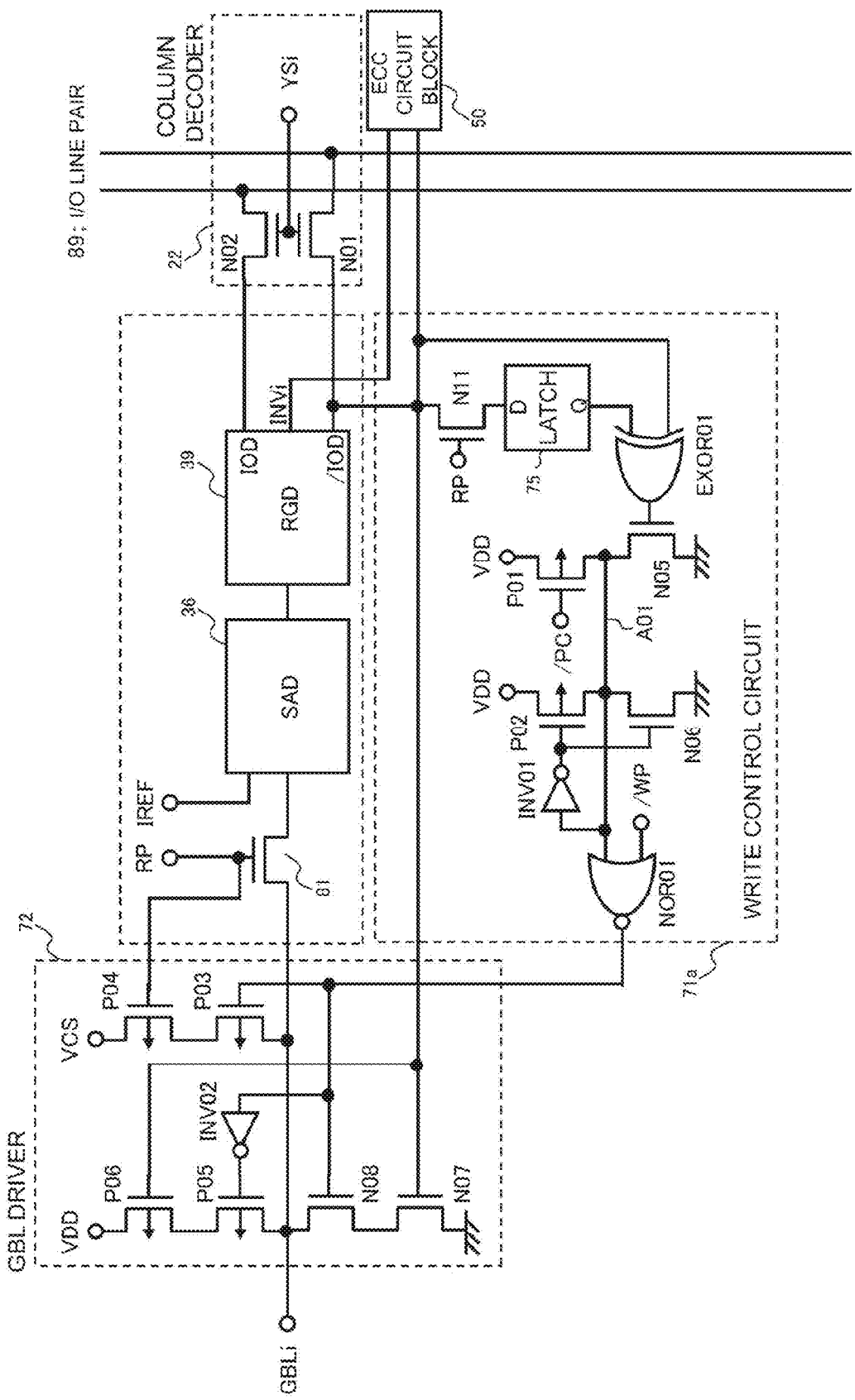
FIG. 10 is a drawing showing an example of the configurations of main circuits used for reading/writing the data bits of a semiconductor device 1*a* relating to a second embodiment.

FIG. 10 shows an example of the configurations of main circuits used for reading/writing the data bits of the semiconductor device 1a.

In FIG. 10, the same signs are given to the components the same as those as shown in FIG. 5, and the explanation thereof will be omitted. With reference to FIG. 10, the write control circuit 71a includes an exclusive OR circuit EXOR01, a latch 75, and an N-channel MOS transistor N11 without the N-channel MOS transistors N02 and N04.

The write control circuit 71a takes data read from the data bit cell into the latch 75 during a period when the read pulse signal RP is at a high level. The node A01 is controlled to be at a low level only when data written to the inverting input/output terminal /IOD due to the error correction performed by the ECC circuit block 50 or a write during the page mode operation is different from the data of the data bit cell initially taken into the latch 75.

As a result, since the global bit line GBL is driven only when inverted data is written to the data bit cell, the write current can be reduced more than the semiconductor device 1 relating to the first embodiment does.

Figure 11:
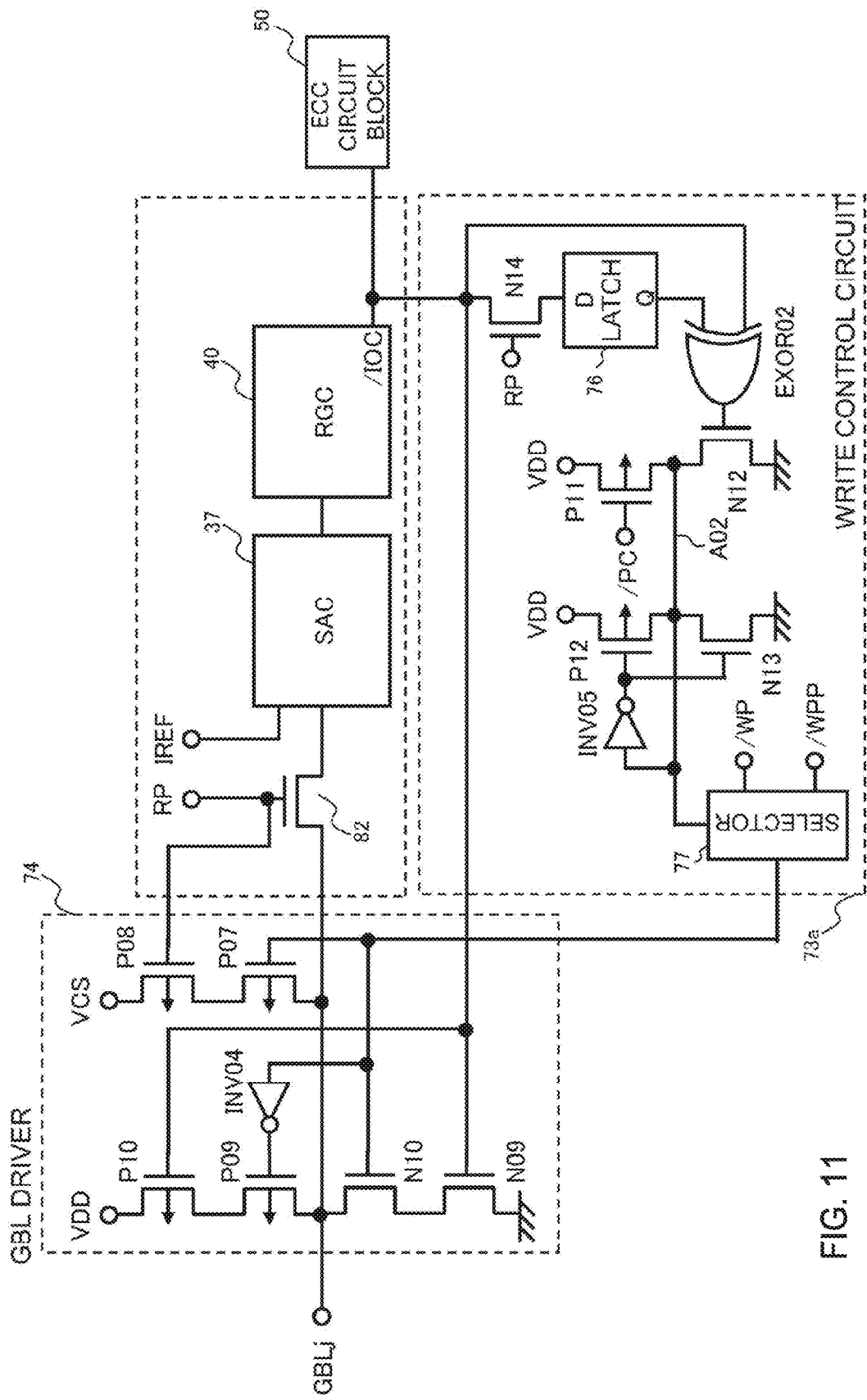
FIG. 11 is a drawing showing an example of the configurations of main circuits used for reading/writing the check bits of the semiconductor device 1*a*.

FIG. 11 shows an example of the configurations of main circuits used for reading/writing the check bits of the semiconductor device 1a. In FIG. 11, the same signs are given to the components the same as those in FIG. 6, and the explanation thereof will be omitted.

The write control circuit 73a basically has the same internal configuration as the write control circuit 71a does. In other words, as the write control circuit 71a, the write control circuit 73a takes data read from the check bit cell into the latch 76 during a period when the read pulse signal RP is at a high level.

Since the error correction by the ECC circuit block 50 is not performed on the check bit in the semiconductor device 1a, a node A02 is controlled to be at a low level only when data written to the inverting input/output terminal /IOC as a result of generating the check bit in response to a pre-charge command is different from the data of the check bit cell initially taken into the latch 76. Further, the node A02 is a connection node between the P-channel MOS transistors P11 and P12, and the N-channel MOS transistors N12 and N13 as shown in FIG. 11.

A selector 77 outputs a check bit write pulse signal /WPP to the GBL driver 74 when the node A02 is at a high level. Conversely, the selector 77 outputs the write signal /WP to the GBL driver 74 when the node A02 is at a low level. Further, the check bit write pulse signal /WPP is a signal generated by the sense amp and ECC control circuit 34.

Here, the pulse width of the check bit write pulse signal /WPP is set shorter than the pulse width of the write pulse signal /WP used in the data bit write circuit 41. However, the drive start timings of the check bit write pulse signal /WPP and the write pulse signal /WP are substantially the same. Consequently, when no inverted write is performed, the supply of the thermal-assist-current is stopped at the point in time when the check bit write pulse signal /WPP goes to a high level.

Further, when an inverted write is performed, it is done taking the same period of time as when the data bit is written (the pulse width of the write pulse signal /WP). As a result, in the semiconductor device 1a relating to the second exemplary embodiment, the write current is reduced further than in the semiconductor device 1.

Further, since the thermal-assist-current is in the direction in which data stored in the check bit cell is written, data in the check bit cell does not get inverted even when the supply of the current is prematurely discontinued.

Figure 12:
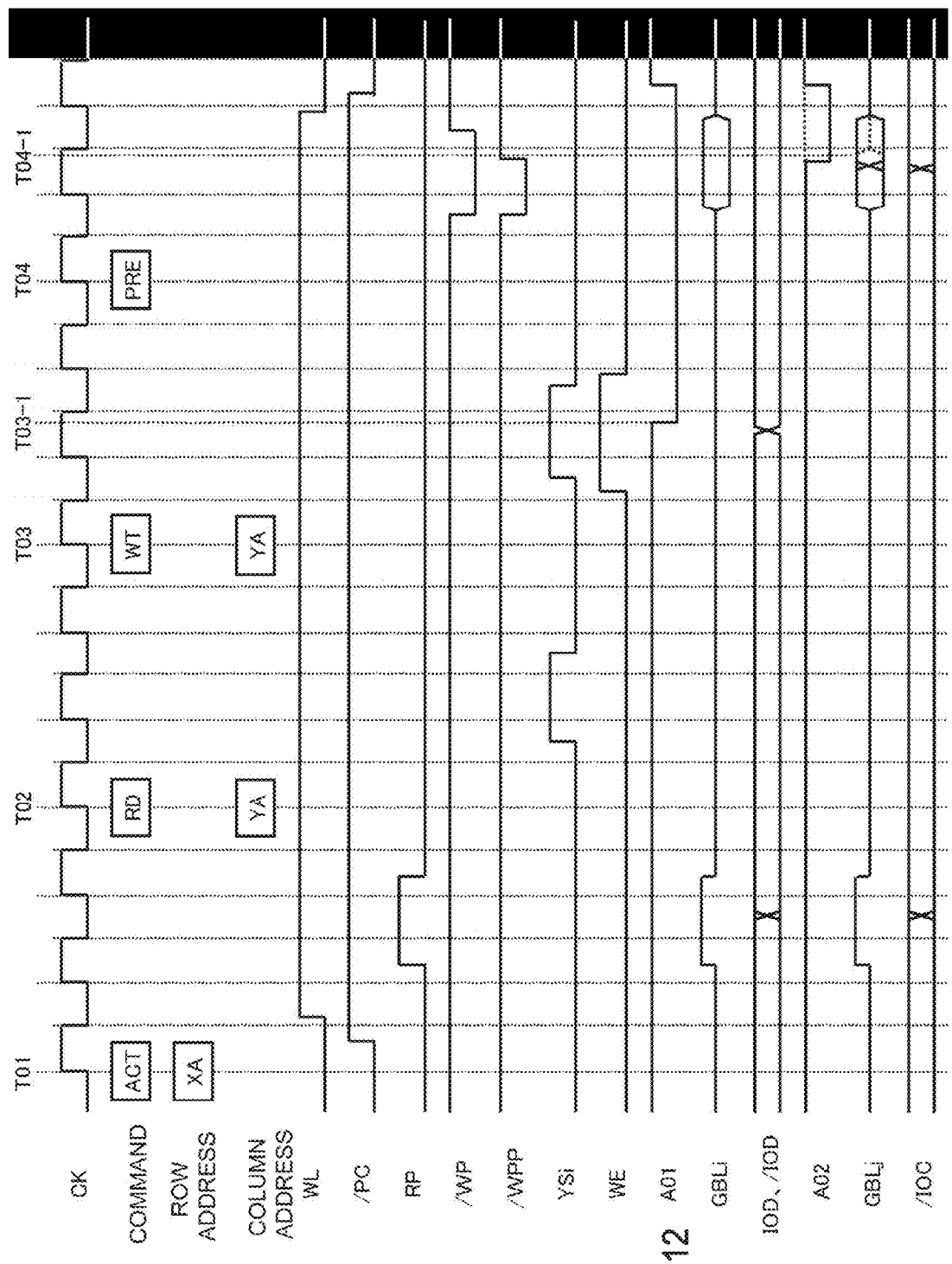
FIG. 12 is a drawing showing an example of the operation waveforms of the semiconductor device 1*a*.

FIG. 12 shows an example of the operation waveforms of the semiconductor device 1a. The differences between the operation waveforms as shown in FIG. 12 and the waveforms as shown in FIG. 9 are that, after the write command WT is supplied, the node A01 transitions to the low level after the input/output terminal IOD and the inverting input/output terminal /IOD get inverted, and the operation of writing to the check bit cell after the pre-charge command PRE is supplied. Therefore, only these differences will be described and other explanations will be omitted.

In the write control circuit 71a, when data accompanying the write command WT differs from the data held by the data bit register 39, the potential of the node A01 goes to the voltage VSS at a timing when the externally supplied data is reflected in the register (time T03-1).

Further, as described above, the pulse width of the check bit write pulse signal /WPP is shorter than that of the write pulse signal /WP. Since the node A02 maintains a high level as indicated by a dashed line when the check bit is not inversely written, the waveform of the global bit line GBLj shows the operation indicated by a dashed line as this write period ends at the point in time when the check bit write pulse signal /WPP transitions to a high level (time T04-1).

Conversely, when the check bit is inversely written, since the node A02 transitions to a low level as indicated by a solid line, the waveform of the global bit line GBLj shows the operation the same as the operation described in the first exemplary embodiment, as indicated by a solid line.

As described above, in the semiconductor device 1a related to the second embodiment, since data is written to the memory cell when the data to be written to the memory cell differs from the data stored in the memory cell, the power consumption is reduced further, compared to the semiconductor device 1 relating to the first exemplary embodiment.

Embodiment 3

Next, a third embodiment will be described with reference to FIG. 13.

Figure 13:
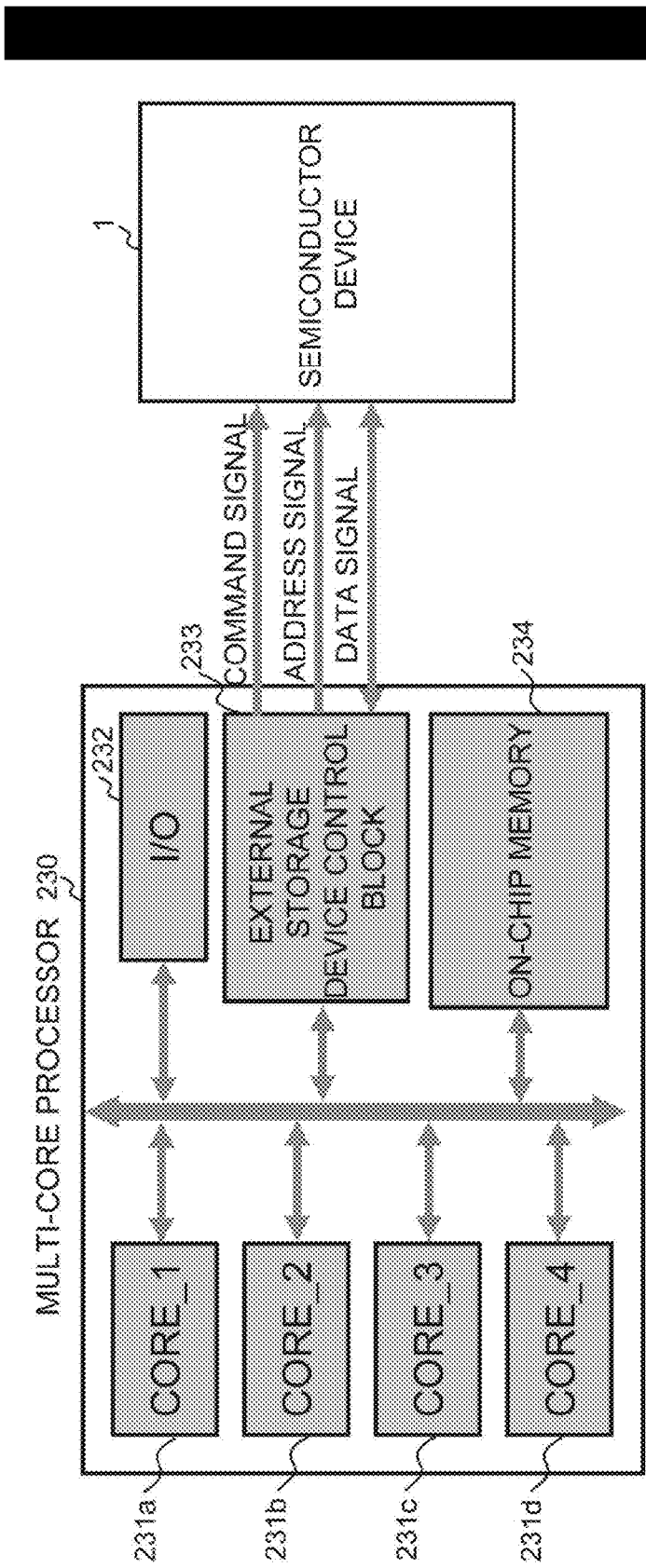
FIG. 13 is a block diagram showing the configuration of an information processing system relating to a third embodiment.

FIG. 13 is a block diagram showing the configuration of an information processing system relating to the third embodiment. In the third embodiment, the information processing system includes the semiconductor device 1 (including the semiconductor device 1a) relating to each embodiment described above, and a multi-core processor 230. The multi-core processor 230 includes cores_1 to _4 (231a to d), an I/O 232, an external storage device control block 233, and an on-chip memory 234, as shown in FIG. 13. The external storage device control block 233 controls the semiconductor device 1 by exchanging the command signals, the address signals, and a data signal with the semiconductor device 1.

According to the information processing system relating to the third embodiment, a large-capacity, low current consumption, and reliable main memory using a resistance variable memory cell can be provided for the multi-core processor 230.

Further, specifications equivalent to a DRAM can be realized while mounting an ECC circuit, suppressing an increase in column access cycle time, minimizing an increase in pre-charge time, and suppressing the current consumption.

Further, the semiconductor device disclosed in each embodiment uses an STT-RAM that performs spin transfer torque writing as a resistance variable element, however, the embodiments described herein are not limited thereto and the content of the disclosure of each embodiment can be applied to a semiconductor device using, for instance, an Re-RAM (Resistive Random Access Memory) using metal oxide or PCM (Phase Change Memory) without departing from what has been disclosed herein.

CONCLUSION

According to an embodiment, there is provided a semiconductor device including first and second memory cell arrays, each including a plurality of memory cells, each of which is connected between first and second terminals and is configured to be written to a first resistance state by applying a first current in a first direction between the first and second terminals and be written to a second resistance state by applying a second current in a second direction opposite to the first direction between the first and second terminals, the first memory cell array configured to store normal information, and the second memory cell array configured to store error-correction information. The semiconductor device may further include an error-correction circuit for generating error-correction information based on normal information, and a control circuit configured to apply a third current to a memory cell of the second memory cell array in one of the first and second direction between the first and second terminals, during a first period when the error-correction circuit generates error-correction information based on the normal information.

According to another embodiment, there is provided a method comprising generating error-correction information based on write information, and applying, during the generating of the error-correction information, an assist current to each of memory cells included in a memory cell array configured to store error-correction information.

It should be noted that other objects, features and aspects of the present application will become apparent in the entire disclosure and that modifications may be done without departing from the scope of the various embodiments disclosed herein, some of which claimed as appended herewith. Also it should be noted that any combination of the disclosed and/or claimed elements, matters and/or items may fall under the modifications aforementioned. In particular, regarding the ranges of numeric values stated in the present disclosure, it should be understood that a numeric value or small range included in these ranges is used as a concrete example even when no specific explanation is provided.

What is claimed is:

1. A device comprising non-transitory computer readable medium, comprising:
   first and second memory cell arrays, each array including a plurality of memory cells, each cell being connected between first and second terminals and configured to be written to a first resistance state by applying a first current in a first direction between the first and second terminals and to be written to a second resistance state by applying a second current in a second direction opposite to the first direction between the first and second terminals,
   the first memory cell array configured to store normal information, and
   a plurality of second latch circuits corresponding to the second memory cell array and configured to store error-correction information;
   an error-correction circuit to generate new error-correction information based on normal information; and
   a control circuit configured to apply a third current to a memory cell of the second memory cell array in one of the first and second direction between the first and second terminals to write a portion of the new error-correction information to a memory cell of the second memory cell array and not to write a remaining portion of the new error-correction information to the memory cell of the second memory cell array, during a first period when the new error-correction information newly generated by the error-correction circuit differs from the error-correction information stored in the second latch circuits.

2. The device according to claim 1, wherein the control circuit is further configured to write the error-correction information that the error-correction circuit has generated to a memory cell of the second memory cell array, after the first period has elapsed.

3. The device according to claim 1, wherein to write the error-correction information that the error-correction circuit has generated to memory cells of the second memory cell array is performed by the first or second current.

4. The device according to claim 1, wherein the control circuit is configured to write the normal information to memory cells of the first memory cell array.

5. The device according to claim 1, further comprising:
a plurality of first register circuits that correspond to the first memory array and temporarily hold the normal information; and
a plurality of second register circuits that correspond to the second memory array and temporarily hold the error-correction information.

6. The device according to claim 5, wherein each of the second register circuits is configured to store information that determines which direction of the third current applied between the first and second terminals of a memory cell corresponding thereto is to be one of the first and second directions.

7. The device according to claim 5, wherein
the error-correction circuit is configured to generate the error-correction information based on the normal information that each of the first register circuit holds,
each of the second register circuit is configured to hold error-correction information that the error-correction circuit generates, and
the control circuit is configured to write error-correction information that each of the second register circuit holds to memory cells of the second memory cell array.

8. The device according to claim 5, wherein
the error-correction circuit is configured to perform error-correction operations to produce, based on first normal read information that has been read from memory cells of the first memory cell array and the error-correction information that has been read from memory cells of the second memory cell array and corresponds to the first normal read information, second normal read information,
each of the first register circuits is configured to hold the second normal read information that the error-correction circuit produces, and
the control circuit is configured to write the second normal read information that each the first register circuit holds to memory cells of the first memory cell array.

9. The device according to claim 7, wherein
the control circuit is configured to write an updated portion, which has been updated, of information held by the first register circuits to memory cells of the first memory cell array and be free from writing a remaining portion of the information held by the first register circuits to a memory cells of the first memory cell array.

10. The device according to claim 8, further comprising:
a plurality of first latch circuits that correspond to the first memory array and hold the normal information, the first latch circuits being different from the first and second register circuits; and
wherein the control circuit is configured to write, when normal information held by the first latch circuit differs from write normal information provided from external, a portion of the write normal information to a memory cell of the first memory cell array and be free from writing a remaining portion of the write normal information to a memory cell of the first memory cell array.

11. The device according to claim 1, wherein the memory cell comprises a resistance variable memory cell.

12. The device according to claim 1, wherein the memory cell comprises an STT-RAM (Spin-Transfer Torque Random Access Memory) cell.

13. A method, comprising:
generating new error-correction information based on write information; and
applying, during the generating of the new error-correction information, an assist current to each of memory cells included in a memory cell array configured to store the error-correction information, wherein a portion of the new error-correction information is written to a memory cell of the memory cells and a remaining portion of the new error-correction information is not written to the memory cell of the memory cells, when the new error-correction information newly generated by the error-correction circuit differs from error-correction information stored in the memory cell of the memory cells.

14. The method according to claim 13, further comprising:
after the applying of the assist current, writing, to the memory cells of the memory cell array, the generated error-correction information that has been generated by the generating of the error-correction information.

15. The method according to claim 13, wherein each of the memory cells comprises a resistance variable memory cell.

16. The method according to claim 13, wherein each of the memory cells comprises a STT-RAM (Spin-Transfer Torque Random Access Memory) cell.

* * * * *